United States Patent [19]

Mooradian

[11] Patent Number: 5,115,445
[45] Date of Patent: May 19, 1992

[54] MICROCHIP LASER ARRAY

[75] Inventor: Aram Mooradian, Winchester, Mass.

[73] Assignee: Massachusetts Institute of Technology, Cambridge, Mass.

[21] Appl. No.: 571,073

[22] Filed: Aug. 22, 1990

Related U.S. Application Data

[60] Continuation-in-part of Ser. No. 512,981, Apr. 23, 1990, which is a division of Ser. No. 308,251, Feb. 9, 1989, Pat. No. 4,953,166, which is a continuation-in-part of Ser. No. 151,396, Feb. 2, 1988, Pat. No. 4,860,304.

[51] Int. Cl.$^5$ .............................................. H01S 3/094
[52] U.S. Cl. ...................................... 372/75; 372/41; 372/92
[58] Field of Search ....................... 372/40, 41, 75, 92

[56] References Cited

U.S. PATENT DOCUMENTS

| | | | |
|---|---|---|---|
| 4,002,725 | 1/1977 | Bridenbough et al. | 423/263 |
| 4,156,206 | 5/1979 | Comerford et al. | 331/94.5 |
| 4,468,850 | 9/1984 | Liau et al. | 29/569 |
| 4,677,629 | 6/1987 | Lesh | 372/18 |
| 4,718,070 | 1/1988 | Liau et al. | 372/50 |
| 4,722,092 | 1/1988 | Liau et al. | 372/96 |
| 4,734,912 | 3/1988 | Scerbak et al. | 372/27 |
| 4,739,507 | 4/1988 | Byer et al. | 372/22 |
| 4,743,091 | 5/1988 | Gelbert | 350/252 |
| 4,760,578 | 7/1988 | Oshima et al. | 372/45 |
| 4,772,787 | 9/1988 | Trommer | 250/227 |
| 4,777,148 | 10/1988 | Liau et al. | 437/129 |
| 4,784,722 | 11/1988 | Liau et al. | 156/649 |
| 4,797,893 | 1/1989 | Dixon | 372/34 |
| 4,807,238 | 2/1989 | Yokomori | 372/32 |
| 4,935,939 | 6/1990 | Liau et al. | 372/98 |

FOREIGN PATENT DOCUMENTS

90/00644 2/1990 European Pat. Off. .

OTHER PUBLICATIONS

"Mass-Transported GaInAsP/InP Lasers", Liau et al., *The Lincoln Laboratory Journal*, vol. 2, No. 1, (1989), pp. 77–94.

"Five Watt Continuous-Wave AlGaAs Laser Diodes", *Electronic Letters*, vol. 22, No. 11, May 22, 1986, pp. 605–606, Harnagel et al.

"2.4 W CW 770 nm Laser Arrays with Nonabsorbing Mirrors", *Electronic Letters*, vol. 23, No. 10, May 7, 1987, pp. 525–527, Welch et al.

"Ultra-High-Power Quasi-CW Monolithic Laser Diode Arrays With High Power Conversion Efficiency", *Electronics Letters*, vol. 23, No. 14, Jul. 2, 1987, pp. 743–744, Harnagel et al.

"High-Power, 8W CW Single-Quantum-Well Laser Diode Array", *Electronics Letters*, vol. 24, No. 2, Jan. 21, 1988, pp. 113–115, Welch et al.

"Two-Dimensional Array of GaInAsP/InP Surface-Emitting Lasers", *Electronics Letters*, vol. 21, No. 4, Feb. 14, 1985, pp. 162–164, Uchiyama et al.

"Spectral Characteristics of External-Cavity Controlled Semiconductor Lasers", Fleming et al., *IEEE Journal of Quantum Electronics*, vol. QE-17, No. 1, Jan. 1991, pp. 44–59.

"Monolithic GaAs/AlGaAs Diode Laser/Deflector Devices for Light Emission Normal to the Surface", Windhorn et al., *Appl.Phys.Lett.* 48(24), Jun. 16, 1986, pp. 1675–1677.

"Angular Chlorine Ion-Beam-Assisted Etching of GaAs and AlGaAs", Goodhue et al., Inst. Phys. Conf. Ser. No. 83: Ch. 7, pp. 349–354.

"Monolithic Two-Dimensional Surface-Emitting Arrays of GaAs/AlGaAs Diode", *Appl. Phys. Lett.* 52 (15), Oct. 12, 1987, Donnelly et al., pp. 1138–1140.

(List continued on next page.)

*Primary Examiner*—James W. Davie
*Attorney, Agent, or Firm*—Hamilton, Brook, Smith & Reynolds

[57] ABSTRACT

A method and apparatus for generating a high power beam of light is described in which individual laser pixel elements are laterally defined and isolated in a wafer of solid state gain medium material and mirrors are formed on each side of the wafer to produce an optical cavity resonator. An array of diode lasers is used to pump adjacent pixels to stimulate light emission by each pixel.

52 Claims, 2 Drawing Sheets

OTHER PUBLICATIONS

"Surface-Emitting GaAlAs/GaAs Linear Laser Arrays with Etched Mirrors", Yang et al., *Appl. Phys. Lett.* 49 (18), Nov. 3, 1986, pp. 1138-1139.

"Coherent Addition of AlGaAs Lasers Using Microlenses and Diffractive Coupling", Leger et al., *Appl. Phys. Lett.* 52 (21), May 23, 1988, pp. 1771-1773.

"High-Performance Heat Sinking for VLSI", Tuckerman et al., *IEEE Electron Device Letters*, Col. EDL-2, No. 5, 1981 pp. 126-129.

"Surface-Emitting Two-Dimensional Laser Diode Arrays Constructed on Zig-Zag Heat Sink Surface", Sheem, U.S. Dept. of Energy by Lawrence Livermore National Laboratory.

"Electron-Beam-Pumped Two-Dimensional Semiconductor Laser Array with Tilted Mirror Resonator", Tong et al., *Appl. Phys. Lett.* 52(16), Apr. 18, 1988, pp. 1303-1305.

"Room-Temperature Pulsed Oscillation of GaAlAs/GaAs Surface Emitting Injection Laser", Iga et al., *Appl.Phys.Lett.* 45(4), Aug. 15, 1984, pp. 348-350.

"Distributed-Feedback Surface-Emitting Laser Diode with Lateral Double Heterostructure", Ogura et al., *Electronics Letters*, vol. 23, No. 14, Jul. 2, 1987, pp. 758-760.

"Phase-Locked Operation of a Grating-Surface-Emitting Diode Laser Array", Carlson et al., *Appl.Phys.Letter.* 50(19), May 11, 1987, pp. 1301-1303.

"Operation of Individual Diode Lasers as a Coherent Ensemble Controlled by a Spatial Filter within an External Cavity", Rediker et al., *Appl.Phys.Lett.*, vol. 46, No. 2, Jan. 15, 1985, pp. 134-135.

Kane, Thomas J. et al., "Frequency stability and offset locking of a laser-diode-pumped Nd:YAG monolithic nonplanar ring oscillator" Optics Letters, 12, pp. 175-177 (1987).

Castleberry, et al., "A Single Mode 2.06 Um Miniature Laser", Digest of Technical Papers, Jan. 21-24, 1974, MB7, pp. 1-4.

Saruwatari, et al., "Electroluminescent Diode Pumped Miniaturized LiNd $P_4O_{12}$ Lasers", Review of the Electrical Communication Laboratories, vol. 26, Nos. 9-10, Sep.-Oct. 1978 pp. 1111-1128.

Owyoung et al., "Stress-induced tuning of a diode-laser-excited monolithic Nd:YAG laser", Optics Letters, vol. 12, No. 12, Dec. 1987, pp. 999-1001.

Zhou et al., "Efficient, frequency-stable laser-diode-pumped Nd:YAG laser", Optics Letters, vol. 10, No. 2, Feb. 1985, pp. 62-64.

Kubodera et al., "Pure single-mode LiNdP4O12 solid-state laser transmitted for 1.3 um fiber-optic communications", Applied Optics, vol. 21, No. 19, pp. 3466-3469.

Kubodera et al., "Efficient LiNdP4O12 lasers pumped with a laser diode", Applied Optics, vol. 18, No. 23, Dec. 1979, pp. 3882-3883.

Winzer et al., "Laser Emission from Miniaturized NdAl3(BO3)4 Crystals with Directly Applied Mirrors", IEEE, 1978, pp. 840-843.

Winzer et al., "Laser Emission from Polished NdP5O14 Crystals with Directly Applied Mirrors", Applied Physics, 11-121-130 (1976).

Owyoung et al., "Gain switching of a monolithic single-frequency laser-diode-excited Nd:YAG laser", Optics Letters, vol. 10, No. 10, Oct. 1985, pp. 484-486.

Stone et al., "Self-Contained LED-Pumped Single-Crystal Nd:YAG Fiber Laser", Fiber and Integrated Optics, vol. 2, No. 1, 1979, pp. 19-46.

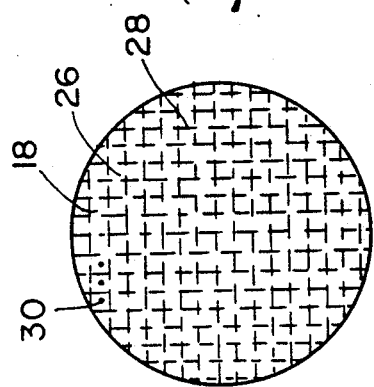
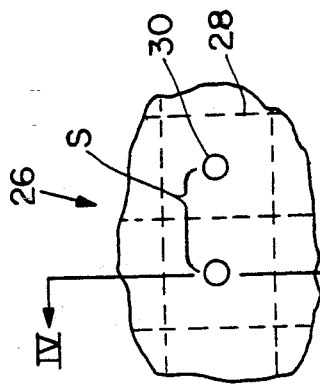
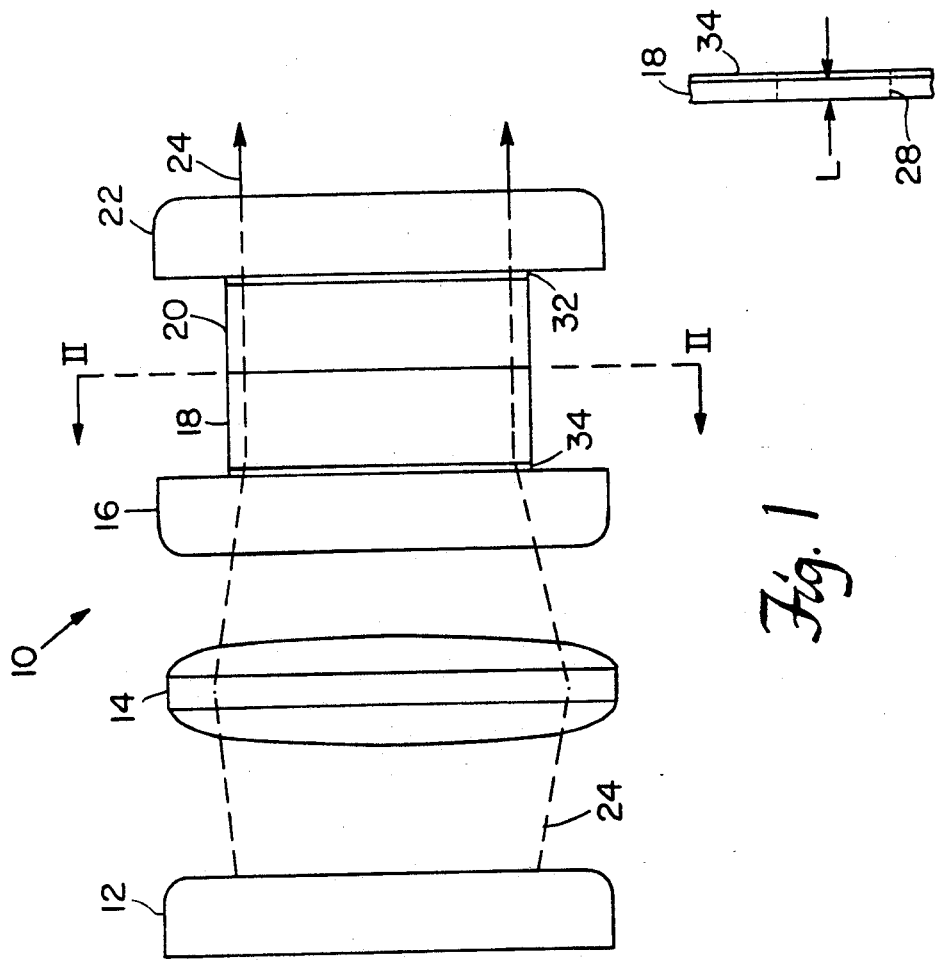

MICROCHIP LASER ARRAY

GOVERNMENT SUPPORT

The Government has rights in this invention pursuant to Contract No F19628-85C-0002 awarded by the Department of the Air Force.

BACKGROUND OF THE INVENTION

This application is a continuation-in-part of U.S. Ser. No. 512,981 filed Apr. 23, 1990 which is a divisional application of U.S. Ser. No. 07/308,251 filed Feb. 9, 1989, now U.S. Pat. No. 4,953,166, which is a continuation-in-part of U.S. Ser. No. 151,396 filed Feb. 2, 1988 (now U.S. Pat. No. 4,860,304) and incorporated herein by reference This invention relates to laser arrays.

Arrays of lasers are of great interest for applications requiring higher power levels than can be attained with single devices. Development efforts to date have concentrated mainly on fabrication of linear arrays of edge-emitting GaAs/AlGaAs lasers.

Harnagel et al., *Electron. Lett.* b 22, 605 (1986) report formation of 5 Watt continuous-wave (CW) AlGaAs 1 mm laser diode bars in the form of monolithic 100 to 140 stripped linear arrays. Welch et al., *Electron. Lett.* 23, 525 (1987) present data on 770 nm, 10 strips AlGaAs laser arrays with a 2.4 W CW output. Similar success is reported by Harnagel et al., in *Electron. Lett.* 23, 744 (1987) and Welch et al., in *Electron. Lett.* 24, 113 (1988).

While these efforts have met with considerable success, a need for still higher power levels have led those skilled in the art, to attempt, along with continuing work on linear diode arrays, to achieve still higher output power by stacking and bonding these linear arrays to form composite two-dimensional arrays In the stacked and bonded array, linear diode laser arrays and slabs of electrical and heat conducting material forming individual heat sinks, are alternately stacked upon each other. The individual heat sinks are then thermally connected at their edges to a main heat sink from which the heat can be removed by several different techniques In this arrangement, heat is transferred from the linear diode laser arrays into the individual heat sinks and then traversely along the individual heat sinks to the main heat sink. It is difficult to transfer heat from the linear laser arrays to the main heat sink and, thus, difficult to maintain temperature uniformity across the entire array. Microchannels, through which cooling fluid could be passed, could be incorporated in the individual heat sinks, but only with a significant increase in fabrication complexity.

As an alternate approach to such composite arrays, monolithic two-dimensional arrays consisting of surface-emitting semiconductor lasers are also being investigated. Several types of surface-emitting GaAs/AlGaAs and GaInAsP/InP diode lasers have been demonstrated. These include lasers with resonant cavities that are normal to the surface [Iga et al., *Appl. Phys. Lett.* 45, 348 (1948); Uchiyama et al., *Electron Lett.* 21, 162 (1985) and Ogura et al., *Electron. Lett.* 23 758 (1987)], lasers that incorporate a chemically etched 45° mirror [A. J. Spring Thorpe, *Appl. Phys. Lett.* 31, 524 (1979)], and lasers that utilize a second-order grating coupler to achieve emission normal to the surface [Carlson et al., *Appl. Phys. Lett.* 50, 1301 (1987)].

A second approach to the fabrication of monolithic two-dimensional arrays is to couple edge-emitting diode lasers with external mirrors that deflect the radiation from the laser facets by 90°. Liau and Walpole [*Appl. Phys. Lett.* 50, 528 (1987)] have fabricated such arrays of devices that combine GaInAsP/InP laser with a parabolic deflector adjacent to one or both facets. The facets and deflectors were formed by selective chemical etching followed by a mass-transport process, other techniques, such as ion-beam-assisted etching (IBAE) [Windhorn et al., *Appl. Phys. Lett.* 48, 1675 (1986); Goodhue et al., *Gallium Arsenide and Related Compounds* 1986, ed. W. T. Lindley (Inst. Phys. Conf. Ser. 83, Briston, 1987, p. 349; Donnelly et al., *Appl. Phys. Lett.* 51 1138 (1987)] and ion milling [Yang et al., *Appl. Phys. Lett.* 49, 1138 (1986)] have been used to form the non-cleaved laser facets and adjacent deflectors Monolithic two-dimensional GaAs/AlGaAs diode laser arrays, in which all of the facets and deflectors were formed by IBAE have recently been reported by Donnelly et al., above. Although these monolithic techniques hold great promise for large-area high-power laser arrays, they are still in the early stages of development. In some of them, the quality of the mirrors and windows are not as good as the conventional cleaved facets found in linear arrays.

Donnelly in U.S Pat. No. 4,881,237 issued Nov. 14, 1989 offers a hybrid approach in which a high power CW. or high average power pulsed array consisting of linear arrays of edge-emitting lasers mounted in grooves formed in substrates, is formed. The substrates are formed of material with good heat conduction properties, such as Si or Cu. The grooves have flat bottoms and 45° sidewalls forming reflective mirrors. In one embodiment, the grooves and sidewalls are etched into a Si substrate containing microchannels for cooling fluid flow.

All of these approaches suffer from fabrication complexity, cost and reliability problems. The present invention offers a relatively low cost and relatively simple and reliable solution to these problems.

SUMMARY OF THE INVENTION

In accordance with the invention, a two-dimensional array of lasers is created by forming a flat wafer of laser solid state material and laterally isolating volumes of said material by introducing optical loss around the isolated volumes and, in this fashion, forming a gain medium array. This array is then disposed between mirrors. In one embodiment of the invention. the distance between the mirrors is selected so that the gain bandwidth of the gain medium is less than, or substantially equal to. the frequency separation of modes of light propagated in the cavity and the frequency of only one such mode falls within the gain bandwidth of the medium. This results in single-frequency emission from the gain medium. Alternatively, the distance need not be so limited where multi-mode operation is desired or can be tolerated.

An array of pumping lasers is formed and disposed adjacent or in contact with one of the gain medium mirrors. The mirror on the side of the gain medium opposite the pumping lasers is transparent to light at the frequency of the pumping lasers and reflective of light emitted by the gain medium; whereas the mirror on the output side of the gain medium is transparent to the gain medium emissions and reflective of the pumping laser transmission. In this manner, a two-dimensional laser array is formed in which the pumping lasers stimulate emission of light from each of the gain medium volumes adjacent each pumping laser. Each isolated volume thus forms a pixel. Preferably, the pumping lasers are comprised of an array of diode lasers, each diode laser corresponding to a pixel in the gain medium.

As noted in the parent application, the wafer slabs can be substantially thin. i.e., about 730 μm, or less, for materials such as Nd YAG. Heat generated in the medium can be efficiently conducted in a substantially longitudinal direction, rather than transversely across the array by providing an optically transparent heat exchanger at one end of the array. (preferably the output end) to prevent destruction of the array by excessive heat.

An optional lens or binary optic lenslet array may be coupled between the output of the two-dimensional pumping laser array and the gain medium cavity array to focus light onto the isolated gain medium volumes.

Also, an array of non-linear optical converters for generating higher harmonics or parametrically converted lower frequencies of the laser light emissions may be coupled, as by bonding to the output side of the gain medium cavity, thereby adding to the versatility of the array.

Finally, an integrated circuit chip formed of transparent material, such as Si, with control elements and drive circuits may be bonded to an output face of the converter array to control and phase steer the output beam of the array.

The resultant structure is relatively simple to fabricate and is robust in design, resulting in high reliability and low down time. Failure of isolated elements of the array do not result in catastrophic failure of the entire system.

BRIEF DESCRIPTION OF THE DRAWINGS

FIG. 1 depicts a two-dimensional laser array system of the invention.

FIG. 2 is a front view of the gain medium array 18 taken along lines II—II of FIG. 1.

FIG. 3 is an enlarged fragmentary view of a portion of the array 18 of FIG. 2.

FIG. 4 is a sectional view taken along lines IV—IV of FIG. 3.

DESCRIPTION OF THE PREFERRED EMBODIMENT

Figure 5:
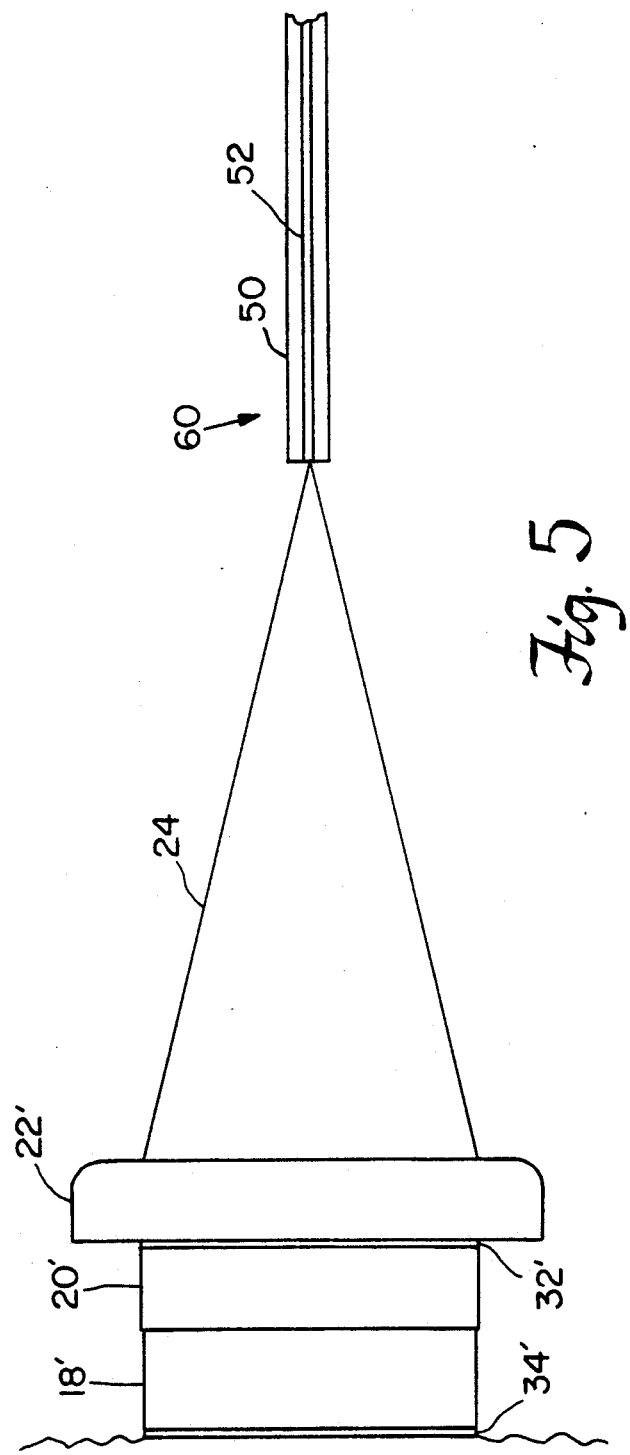
FIG. 5 is a partial sectional view of an alternate embodiment.

The theory on which the present invention is based is explained in parent application. U S. Ser. No. 512,981. In essence, it states that single mode laser oscillation may be achieved by forming a laser cavity in which the cavity length l is less than $c/2n\nu_g$, where $\nu_g$ = gain bandwidth. To insure that the gain medium will lase, it is necessary that there be at least some overlap of the gain curve with one of the intracavity modes. Assuring such overlap is accomplished by an appropriate choice of gain material and cavity length. The resultant laser is termed a microchip laser, since it can be fabricated in micro-size dimensions. Typically, a microchip laser is comprised of a solid-state gain medium disposed between a pair of mirrors. The mirrors are coated with multiple layers (20-30 layers) of dielectric material. The gain medium is pumped optically by a laser, preferably a diode laser array. The output light is focused by a lens onto one of the mirrors. The mirror adjacent the pump laser transmits light from the pump laser but reflects light generated within the gain medium. The output mirror functions in reverse. The length l of the gain medium is selected so that $l \leq c/2n\nu_g$ where $\nu_g$ is the bandwidth of the gain medium. In this case, a single mode only will oscillate within the gain medium when the absolute frequency of the cavity mode falls within the gain bandwidth so that the output light from the laser is single frequency. The mirrors may be separate elements bonded directly to the gain medium or they may be multilayer coatings deposited directly on the opposing flat surfaces of the gain medium.

Optionally, a dielectrically coated flat wafer of a nonlinear optical material may be located to receive light from the microchip laser. The nonlinear optical material has the property that, when exposed to monochromatic light, it generates a beam of light including harmonics of the incident beam. Suitable nonlinear optical materials are for example, $MgO:LiNbO_3$ and KTP (potassium titanyl phosphate). The microchip laser may be continuously tuned by a number of techniques that are well known. including the application of a longitudinal or transverse stress to the crystal or by modifying the refractive index of the crystal, thermally.

An harmonic crystal with its own resonant cavity may be provided separate from the microchip laser or it may be bonded directly to the output end of the microchip laser using an optically transparent cement. The use of flat-flat cavities on the harmonic crystal simplify the fabrication process by using similar wafer processing technology as that for the microchip laser However, any of the well-known techniques for a resonant harmonic cavity may also be used in conjunction with the microchip laser, such as the unidirectional ring resonator or spherical mirror cavity. Further, the nonlinear material may be incorporated within the laser cavity itself.

In addition to harmonic generation by means of a suitable nonlinear material, nonlinear frequency conversion may be carried out in suitable nonlinear optical materials using optical parametric oscillation or amplification, as well as frequency sum or difference mixing, using the single frequency microchip laser. Similar cavity fabrication may be used to create a microchip laser whose single frequency light is frequency converted by parametric conversion into light of two lower frequencies. In this parametric conversion microchip laser, the resonators differ from those previously described only in that the nonlinear optical material is a parametric conversion material, such as $LiNbO_3$ or $KNbO_3$ and the cavity coatings are chosen according to the well-known art form for such devices. All of the above is set forth in the referenced parent application.

Referring now to FIG. 1, a microchip laser array system 10 will now be described in connection therewith. In this system, the gain medium array 18 is formed by simply not dicing the gain medium into separate chips, as described in the parent application. That is, by leaving the microchip laser in wafer form, and associating the microchip laser wafer with two-dimensional diode laser array 12 to pump the microchip laser array, a two-dimensional array of microchip lasers is immediately formed. The two-dimensional array of microchip lasers consists of an array of laser diodes 12 in which pumping light from each diode in array 12 is focused by lens 14 on the individual volumes or pixels 26 of the gain medium (FIGS. 2 and 3) of 18.

Each pixel 26 is laterally isolated from its neighbor by introducing a lossy barrier 28 horizontally and vertically through the width of the wafer to spoil the gain and prevent transverse lasing One way to generate the lossy barrier is to cut slots in the wafer around each pixel and fill in the slots with lossy material. Another way would be to particle (ions, electrons, etc.) bombard, dopant diffuse, or otherwise introduce absorption centers in the gain medium along these lines. Light from the laser diodes array 12 excites the microchip laser pixels 26 causing emission of light at spot 30.

An important feature of the present invention is the heat transfer capability of the present invention and, in particular, the essentially longitudinal heat conducting aspect of the gain medium array 18 when combined with a light transparent high thermal conductivity body coupled to the light output side of the array 18.

The gain medium of the present invention can be fabricated from an extremely thin wafer. For example, the length L of the wafer can be equal to approximately 730 $\mu$m in the case of 1.06 $\mu$m Nd:YAG material. Heat generated in the gain medium may thus be conveniently coupled out of the array 18 by simply bonding a transparent body 16 having good heat conductivity properties, such as sapphire or diamond, or equivalent other material to one end of the array 18, preferably the end with the mirror 34 as in FIG. 1. Optionally, microchannels (not shown) for introducing coolant to increase thermal transfer may be formed in body 16, as necessary.

As compared to a single large laser which would generate equivalent power, the present invention greatly reduces the volume of each pixel of light; hence the heat removal rate is much greater than if the volume of all pixels were equal to the volume of the single laser.

This longitudinal heat transfer feature enables scale-up of the array size and a proportional increase in output power. Each array element, or pixel, may occupy about 1 mm$^2$ of area, or less. Each pixel may generate 0.1 Watts or more of power A 100 by 100 pixel array is therefore capable of generating 10,000×0.1 Watts or 1 kw of power while occupying an area of only 10,000 mm$^2$. It is further contemplated that by suitable scaling 1000 by 1000 pixel arrays, or higher, can be fabricated as above to produce 100 kw or higher output power.

Optionally, the microchip laser wafer 18 may be combined with nonlinear optical material 20 within a resonant cavity formed between mirrors 34 and 32 to provide frequency conversion. If, however, the nonlinear optical material is not incorporated in the cavity, an array can still be constructed by simply placing a wafer with nonlinear optical material and Fabry-Perot resonant cavity in association with the other wafers, as shown in FIG. 8b of the parent application. The resonant frequency of the nonlinear optical material cavity must be matched to the microchip frequency in the manner described above. For sufficiently high power from each pixel, a nonlinear frequency converter material may be bonded to the array without the use of a resonant cavity around the nonlinear material.

By properly modulating the phase of each microchip laser spot 30 using, for example, individually addressable phase modulators placed in the path of the output beam or within the cavity of each microchip laser, it is possible to phase steer the array beam 24 and thereby direct the beam. These phase modulators may be integrally formed on a silicon wafer 22, along with addressable drive circuits and bonding pads. The silicon material is bonded to the electro-optic material which serves as the phase modulator and provides the surface for the electrodes which drive the electro-optic phase modulator array. Electro-optic material, such as GaAs or Lithium Niobate may also be used in place of the silicon, since the electrodes may be placed in a cavity formed on such material.

Also, the output of the two-dimensional array of single-frequency microchip lasers may be coherently combined into a single beam using well-known techniques of binary optics (not shown).

The two dimensional array 18, according to the invention, exhibits low pump threshold, high efficiency, and single frequency operation.

The laser pixels 26 can be continuously tuned across their gain-bandwidth in a single frequency using a transversely or longitudinally applied stress applied to the gain medium or by applying a voltage to an intracavity electro-optic modulator. The incorporation of nonlinear optical material either inside or outside of the cavity, generates higher harmonic frequencies or parametrically generated lower frequencies. The output from such an array, in the visible or ultraviolet region, is useful for read and write optical discs projection television applications, and at high powers is useful for materials processing, etc. By phase locking the individual pixel beams to a coherent laser oscillator signal and adding a binary optical lenslet array in the path of the beam, the combined beam can result in a diffraction limited beam capable of being focused on a precise spot, which would be useful for eye surgery and the like.

Referring now to FIG. 5, an alternate embodiment will be described in which like elements from FIG. 1 retain the same numeral references with a prime suffix. It is also assumed that the items to the left of the mirror 34' in the drawings of FIG. 1, are present and unchanged. In the embodiment of FIG. 5, a plurality of gain medium pixels in the array 18' are tuned to different frequencies by any of the techniques described in the parent application, such as stress tuning. electro-optic crystal tuning, thermal tuning, etc. Upper or lower frequencies are generated by non-linear optical array 20' and the resultant beam of light 24' is focused by binary optic lens 22' onto a fiber optic bundle 60 consisting of cladding 50 and a core 52 of one or more fibers or separate fibers (single or multi-mode) bundled together. In this manner, a multi-frequency wide band communication system can be formed with each frequency transmission constituting a separate signal which can be modulated by well-known means.

The gain medium array need not be a flat-flat shape, but may be formed with a variety of curvatures to provide a stable or unstable resonator when the mirrors are formed over the surface.

Individual power supplies may be used to power each pump diode laser or groups of diode lasers to further enhance complete system reliability.

An external cavity may be formed, as suggested by Fleming et al. in IEEE *J. Quantum Electron.*, QE-17, 44 (1981) by adding a partly reflective feedback mirror adjacent to the gain medium array. Moreover, by using the Talbot self-imaging effect [J. R. Leger. M. L. Scott and W B. Veldkamp. *Appl. Phys. Lett.* 52, 1771 (1988)] in which the feedback mirror is placed at one of the Talbot distances, efficient diffraction coupling and phase control can be obtained. In this way, each pixel can be phase controlled such that the entire array can be coupled together and operate coherently like a single laser. Alternatively, phase control can be achieved by use of a Fourier transform spatial filter [R. H. Rediker et al., *Appl. Phys. Lett.* 46, 133 (1985)].

Equivalents

This completes the description of the preferred embodiment of the invention. It should be understood that those skilled in the art would be capable of devising equivalents by various changes in form and detail without departing from the spirit and scope of the invention. Such equivalents are intended to be covered by the following claims.

I claim:

1. A system for generating a beam of light comprising an array of solid state lasers comprised of:
   a) an array of solid state gain medium material lasers comprised of:
   a) an array of solid state gain medium material formed of:
      (i) a body of gain material having first and second opposed surfaces with individual pixel elements formed therein and laterally isolated from each other;
      (ii) a first mirror formed on said first surface which is reflective of light at a first wavelength;
      (iii) a second mirror formed on said second surface which is reflective of light at a second wavelength; and
      (iv) an array of pumping lasers disposed adjacent said first surface for generating light at said second wavelength and each pumping laser stimulating light emission at said first wavelength in a corresponding pixel element to form a beam of light.

2. The system of claim 1 including a transparent thermally conductive means coupled to at least one surface of the body.

3. The system of claim 1 wherein the pixel elements are isolated by lossy material formed between elements.

4. The system of claim 2 wherein the lossy material is formed by introducing defects which absorb emissions.

5. The system of claim 4 wherein the defects are introduced by particle bombardment.

6. The system of claim 1 further including a body of nonlinear optical material for generating harmonics of the light emission of said gain medium.

7. The system of claim 1 wherein the pumping lasers are bonded to the first mirror on the body.

8. The system of claim 1 further including phase means for moving the beam of light.

9. The system of claim 8 wherein the phase means comprises addressable phase modulators.

10. The system of claim 1 including combining means for coherently combining the light emission from each pixel into a coherent light beam.

11. The system of claim 10 wherein the combining means is comprised of binary optics.

12. The system of claim 6 wherein the harmonics are at a higher frequency than the light emission.

13. The system of claim 10 wherein the combining means includes an external cavity formed by a feedback mirror.

14. The system of claim 2 wherein the thermally conductive means comprises a body of material taken from the group comprising sapphire or diamond.

15. The system of claim 1 wherein the array is two dimensional.

16. A system for generally a beam of light comprising an array of solid state lasers comprised of:
   a) an array of solid state gain medium material formed of:
      (i) a body of gain material having first and second opposed surfaces;
      (ii) a cavity formed of:
         light reflective means formed on said first surface; and light transparent means formed on said second surface; and wherein the length of said body between the light reflective and light transparent means is sufficient to cause the gain bandwidth of the gain medium to be less than or equal to the frequency separation of the light propagating in several modes within the cavity and such that the frequency of one such mode is within the gain bandwidth and wherein said gain medium material is divided into an array of pixel elements; and
   b) an array of pumping lasers disposed adjacent said first surface for generating light and stimulating the gain material in each adjacent pixel into light emission to form a beam of light.

17. The system of claim 16 wherein the light reflective means reflects light at the frequency of the gain medium and the light transparent means is transparent to such frequency.

18. The system of claim 17 wherein a light transparent high quality heat dissipating body is longitudinally coupled to said pixel elements.

19. The system of claim 16 further including a body of nonlinear optical material for generating harmonics of the light emission of said gain medium.

20. The system of claim 16 including means for changing the frequency of the stimulated emission of light.

21. The system of claim 16 wherein the pumping lasers are bonded to the body.

22. The system of claim 19 further including phase means for moving the beam of light.

23. The system of claim 22 wherein the phase means comprises addressable phase modulators.

24. The system of claim 16 including combining means for coherently combining the light emission from the gain material into a coherent light beam.

25. The system of claim 24 wherein the combining means is comprised of binary optics.

26. The system of claim 16 wherein the array is two dimensional.

27. A method of generating a beam of light comprising the steps of:
   a) disposing a solid state gain medium between two mirrors forming a cavity and laterally isolating the gain medium to form individual pixels; and
   b) pumping the gain medium with light.

28. The method of claim 27 wherein the distance, l, between the mirrors satisfies the inequality: $1 < c/2n\nu_g$ where c is the speed of light, n is the refractive index in the gain medium, and $\nu_g$ is the gain bandwidth of the gain medium.

29. The method of claim 27 wherein the mirrors are formed by depositing coatings on opposing surfaces of the gain medium.

30. The method of claim 27 wherein the mirrors are bonded to opposing surfaces of the gain medium.

31. The method of claim 27 wherein the gain medium is Nd:YAG

32. The method of claim 27 wherein the pixels are isolated by forming lossy sites in the gain medium.

33. The method of claim 32 wherein the sites in the gain medium are formed by particle bombardment 34. A method for generating a beam of light comprising the steps of:
 a) forming an array of solid state gain medium material by:
  (i) providing a body of gain material having first and second planar opposed surfaces;
  (ii) forming individual pixel elements therein and laterally isolating each from each other;
  (iii) disposing the body between a light reflectiver means and a light transparent means; and
 b) stimulating light emission in a pixel element to form a beam of light.

35. The method of claim 34 including coupling a transparent thermally conductive means to at least one planar surface of the body.

36. The method of claim 34 wherein the pixel elements are isolated by forming lossy material between elements.

37. The method of claim 34 wherein the lossy material is formed by dopant diffusion into the solid state material.

38. The method of claim 34 wherein the elements are isolated by ion bombardment.

39. The method of claim 34 further including forming a body of nonlinear optical material for generating harmonics of the light emission of said gain medium.

40. The method of claim 34 wherein the emission is stimulated by pumping lasers bonded to the partly light reflective means on the body.

41. The method of claim 34 further including the step of changing the phase of the emission to steer the beam of light.

42. The method of claim 41 wherein the phase is changed by addressable phase modulators.

43. The method of claim 34 including the step of coherently combining the light emission from each pixel into a coherent light beam.

44. The method of claim 34 wherein the gain medium is Nd:YAG and the separation between mirrors is in the range of several hundred $\mu m$.

45. The method of claim 34 wherein the gain medium is Nd pentaphosphate and the separation between the mirrors is in the range of 10–100 $\mu m$.

46. The method of claim 34 wherein semiconductor diode lasers are used to stimulate emission by the pixel elements.

47. The method of claim 46 wherein the semiconductor diode lasers are bonded to one of the mirrors.

48. A system for generating a multi-frequency beam of light comprising an array of solid state lasers comprised of:
 a) an array of solid state gain medium material formed of:
  (i) a body of gain material having first and second opposed surfaces with individual pixel elements formed therein and laterally isolated from each other;
  (ii) a light reflective means formed on said first surface;
  (iii) a light transparent means formed on said second surface; and
  (iv) an array of pumping lasers disposed adjacent said first surface for generating light and each pumping laser stimulating light emission in a corresponding pixel element to form a beam of light, a plurality of said pixel elements emitting light of different frequencies.

49. The system of claim 48 including means for focusing the light from said pixel elements on an optical fiber.

50. The system of claim 48 wherein the array is two dimensional.

51. A method of generating a multi-frequency beam of light comprising the steps of:
 a) disposing a solid state gain medium between two mirrors and forming a cavity and laterally isolating the gain medium to form individual pixels, a plurality of pixels being tuned to different frequencies.

52. The method of claim 51 wherein the gain medium is pumped by lasers to emit light from the pixels and coupling said light to an optical fiber.

* * * * *

UNITED STATES PATENT AND TRADEMARK OFFICE
CERTIFICATE OF CORRECTION

PATENT NO. : 5,115,445
DATED : May 19, 1992
INVENTOR(S) : Aram Mooradian

It is certified that error appears in the above-identified patent and that said Letters Patent is hereby corrected as shown below:

Delete Col. 7, lines 15 and 16.

Col. 7, line 67, delete "generally" and insert ---generating---.

Col. 9, line 12, delete "reflectiver" and insert ---reflective---.

Signed and Sealed this

Third Day of August, 1993

Attest:

MICHAEL K. KIRK

Attesting Officer    Acting Commissioner of Patents and Trademarks